United States Patent [19]

Dickinson

[11] Patent Number: 4,960,671

[45] Date of Patent: Oct. 2, 1990

[54] STABILIZED PHOTOSENSITIVE SCREEN PRINTING DISPERSION COMPOSITION WITH DIAZO CONDENSATE, POLYVINYL ALCOHOL, AND COPOLYMER OF VINYL ACETATE AND N-METHYLOC ACRYLAMIDE

[76] Inventor: Peter Dickinson, 11,Knights Avenue, Broadstairs, Kent, England

[21] Appl. No.: 440,311

[22] Filed: Nov. 22, 1989

Related U.S. Application Data

[63] Continuation of Ser. No. 131,036, Dec. 8, 1987, abandoned, which is a continuation of Ser. No. 795,346, Oct. 30, 1985, abandoned.

[30] Foreign Application Priority Data

Mar. 2, 1984 [GB] United Kingdom ................ 8405549
Mar. 1, 1985 [WO] PCT Int'l Appl... PCT/GB85/00086

[51] Int. Cl.$^5$ ......................... G03F 7/016; G03C 1/60
[52] U.S. Cl. ..................... 430/175; 430/157; 430/176; 430/308
[58] Field of Search ............... 430/175, 176, 157, 289, 430/274, 308

[56] References Cited

U.S. PATENT DOCUMENTS

| | | | |
|---|---|---|---|
| 3,100,150 | 8/1963 | Chisman et al. ................... | 430/289 |
| 3,853,561 | 12/1974 | Reichel et al. ..................... | 430/175 |
| 4,021,243 | 5/1977 | Steppan et al. ..................... | 430/175 |
| 4,118,233 | 10/1978 | Tsunoda et al. ........................ | 430/6 |
| 4,154,614 | 5/1979 | Tsunoda et al. ..................... | 430/176 |
| 4,288,520 | 9/1981 | Sprintschnik et al. .............. | 430/175 |
| 4,339,529 | 7/1982 | Goldman ............................ | 430/289 |
| 4,339,530 | 7/1982 | Sprintschnik et al. .............. | 430/331 |
| 4,477,552 | 10/1964 | Day et al. ............................ | 430/175 |
| 4,789,621 | 12/1988 | Knoth ................................. | 430/308 |

FOREIGN PATENT DOCUMENTS 1235624 6/1971 United Kingdom .

*Primary Examiner*—Charles L. Bowers, Jr.
*Attorney, Agent, or Firm*—Bacon & Thomas

[57] ABSTRACT

This invention relates to a screen printing stencil composition which comprises (a) a stabilized aqueous dispersion of a water insoluble addition copolymer having units of formulas: A and B where A is preferably a polyvinyl acetate group and B is preferably a polyvinyl n-methylol acrylamide group and B comprises about 3% by weight of the copolymer; (b) a water soluble colloid; and (c) a photosensitizer. The composition is useful in the formation of a screen printing stencil, the composition having both a long stable profile and forming a durable stencil; the composition on exposure through a photographic positive can be developed with water and cross-linked with acid.

1 Claim, No Drawings

STABILIZED PHOTOSENSITIVE SCREEN PRINTING DISPERSION COMPOSITION WITH DIAZO CONDENSATE, POLYVINYL ALCOHOL, AND COPOLYMER OF VINYL ACETATE AND N-METHYLOC ACRYLAMIDE

This application is a continuation of U.S. Ser. No. 131,036 filed Dec. 8, 1987, now abandoned; which in turn is a continuation of U.S. Ser. No. 795,346 filed Oct. 30, 1985, now abandoned.

TECHNICAL FIELD

This invention relates to compositions useful in screen printing, particularly in the production of stenicls for the process of screen printing. It also relates to a method of producing a screen printing stencil.

BACKGROUND ART

A screen printing stencil can be made in two or a combination of the two ways. An indirect screen printing stencil is prepared by utilising a presensitised photostencil material which has been coated onto a temporary film support. The presensitised film is exposed through a photographic positive, developed to produce an image on that support, which is then transferred to the screen printing mesh to provide a printing mask.

A direct screen printing stencil is prepared by applying a photosensitive solution, emulsion or dispersion to the surface of the screen printing mesh, drying, exposing through a photographic positive and washing out the unexposed areas of the stencil again to provide a printing mask.

The direct process is said to provide superior wear properties and the indirect process to give superior printing with less saw tooth effect caused by shrinkage of the drying coating on the mesh. Also known is the so called direct/indirect process in which the indirect film is laminated to the mesh by a direct stencil solution, emulsion or dispersion, exposed through a photographic positive and the unhardened areas developed away to provide a printing mask.

The present invention finds particular application in direct photostencil coatings and their use in screen printing.

Useful compositions for direct screen printing coatings are described in GB-A-998838 and GB-A-1069366. Here a support is coated with a colloid layer containing an aldehyde in admixture with a diazonium compound or with a condensation product of formaldehyde and a diazonium compound. The diazonium compound is derived from certain di-amino compounds and it may be modified to form a triazene derivative using certain secondary amines.

The sensitised colloid layer is applied to a tensioned mesh or porous substrate and in the direct screen printing process this would usually be achieved with the aid of a suitable applicator known to those skilled in the art of making direct screen printing stencils. Multilayers of the coating may be applied, sometimes with intermediate drying, in order to build up a suitably thick layer to give the coating strength and to minimise the saw tooth effect caused by the mesh. The mesh support is usually polyamide or polyester, metal or silk. The applied coating is dried with warm air to provide a film. This coating is then exposed through a photographic positive in a vacuum frame to ultraviolet radiation. The unexposed areas are washed by water from the mesh, the remaining exposed areas forming a printing mask which, when dried, is suitable for the screen printing process.

The diazo sensitised colloid described above may be of any number of types as described in GB-A-998838 but are more normally of polyvinylalcohol produced by the saponification of polyvinylacetate. Fillers such as finely dispersed polyvinyl acetate may be added to the coating to improve the properties of the stencil in some way for a particular application. For example in a coating using an aqueous dispersion of polyvinyl acetate as filler the ratio of filler to colloid can influence the resistance of the resultant screen printing stencil to the various screen printing media. Thus a coating for producing a stencil for solvent based printing media would only contain a relatively small amount of polyvinyl acetate filler as this could be affected by the solvent. On the other hand a stencil for water based printing media would have a larger amount of polyvinyl acetate filler to imporve the water resistance of the coating. The amount of polyvinyl acetate would be limited by the amount that could be included in the formulation but still allow development by a water spray to give good image reproduction.

It is already known to those skilled in the art of producing stencils that the treatment of the above mentioned stencils with strongly acidic solutions after development does render them more resistant to water. However, this process in fact gives only a marginal improvement. Water resistance may however be further improved by the incorporation of acid crosslinkable resins dispersed into a water soluble colloid, preferably polyvinyl alcohol. Hitherto this has been accomplished by dissolving a water insoluble reactive resin such as a urea formaldehyde resin in a solvent and adding this with vigorous stirring to the colloidal solution. When sensitised and used to form a screen printing stencil, such a stencil can be hardened after exposure and development by treatment with an acidic solution, which causes the acid reactive resin to crosslink. This type of emulsion has the disadvantage that the solvent used escapes during stencil drying giving a strong unpleasant odour and a fire hazard. It is also possible to mill certain reactive copolymers into a screen coating solution but these provide only a weak crosslinked film. Water soluble acid crosslinkable copolymers when added to the coatings have been found to be unstable or provide only limited water resistance when cured.

It is an object of this invention to benefit on the one hand from the inclusion of acid crosslinkable dispersible resins in the composition but without incurring the penalties either of using dangerous or noxious solvents or of losing composition stability.

Published Japanese Applications Nos. 137833/83 and 137834/83 disclose a photosensitive composition comprising an aqueous solution of a saponified copolymer of an N-alkoxymethyl acrylamide and vinyl acetate. When exposed to actinic radiation a photoinitiator also included in the composition initiates crosslinking of the alkoxymethyl groups so that the composition acquires a useful degree of water resistance and thus could be used in a screen printing application.

However there are a number of disadvantages with these compositions, at least insofar as they are applicable to screen printing.

Firstly they are compositions designed for use in photoengraving and the coating of television tubes and would be unlikely to provide the wear characteristics to enable coated films to undergo the rigours of screen printing with water based inks, without post image development processes that would be incompatible with the other materials used in the screen printing process.

Further, the crosslinking N-methylol ether groups are attached to the water soluble polyvinyl alcohol and are thus likely to be affected by water soluble acid produced by degradation of water soluble diazo sensitisers, whether this be thermal or photolytic. Thus compositions with N-methylol ether groups in the aqueous phase might be expected to show signs of instability.

Thus it is a further object of the present invention to overcome or at least mitigate these problems.

SUMMARY OF THE INVENTION

In accordance with the invention there is provided a screen printing stencil composition comprising:

(a) a stabilised aqueous dispersion of a water insoluble addition copolymer having at least one each of units of the formulas:

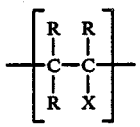

A and

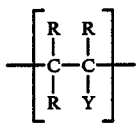

B where each R and X may be the same or different and are selected from the group comprising hydrogen, aryl, substituted aryl, alkyl, substituted alkyl, halogen, cyano, carboxylic acid, carboxylic ester, carboxylic amide, acetal, hydroxyl and anhydride groups, provided always that neither R nor X comprises an hydroxyl group to the extent that the copolymer is rendered soluble in water, and Y is an acid crosslinkable moiety containing an N-methylol group or an alkyl ether or a Mannich base of such agroup;

(b) a water soluble colloid; and, (c) a photosensitiser, (although this may be absent from the composition until such time as a stencil is to be coated, whereupon the sensitiser, supplied separately, would be mixed into the composition).

Such units A and B are conjoined to form a block, graft or random copolymer. The copolymer preferably includes units of formula B in amounts not exceeding 20% by weight, preferably in the range 1% to 10% by weight. The units may be arranged to form linear or branched copolymers. Such a copolymer may consist of several types of A and B units but must always contain at least one of each type A and B, and always to provide a water insoluble copolymer dispersion which is stabilized by small amounts of water soluble colloid or surfactant.

The water soluble colloid referred to in paragraph (b) above and which is an essential part of the composition according to the invention, is present either the or a part of the copolymer stabilisation and/or is present by further addition to the copolymer to facilitate water developability of the coating after exposure. The water soluble colloid may be of any suitable type, for example, polyvinylalcohol, polyvinylpyrrolidone, polyacrylic acid and/or their water soluble copolymers, dextrine, starch, gelatin or cellulose derivatives. Polyvinylalcohol is preferred however and may be saponified polyvinyl acetate having a degree of hydrolysis from 77–100% but preferably from 87–95%, and which may be present in the composition at up to 30% by weight.

The photosensitiser may be any which is capable, on exposure to actinic radiation, of insolubilising the aforementioned water soluble colloid when used in combination with it—either in admixture therewith or chemically combined to the colloid. Such sensitisers include azides, diazonium compounds, nitro compounds, styryl compounds and dichromate. Such sensitisers may be added to the composition just prior to use if desired.

The preferred photosensitiser in the present invention is a diazo sensitiser, for example of the type described in GB-A-998838 and GB-A-1069366 or it may be more complex such as an aromatic diazo compound condensed with any acid condensable active carbonyl compound. The aromatic diazo group may be partially replaced with non-diazo containing reactive groups such as phenols, or the —NH— group of the diazo compounds described in GB-A-998838 may be replaced with —O—, —S— or —CONH— groups.

These diazo compounds may be utilised as a solution in strong acid, for example 85% phosphoric acid or as a powder, usually stabilised by Lewis acids. The buffer levels of the compositions are usually adjusted to give a sensitised pH of between 3.5 and 5.5. The amount of sensitiser added is between 0.3 and 5% by weight but more favourably between 0.5 and 2%.

The composition may also be sensitised using dichromate solutions which are usually sodium, potassium or ammonium dichromate. The amount of dichromate utilised is between 0.3 and 5% by weight. However, diazo sensitisers are preferred, as they give a longer sensitised pot life.

Other components of prior art compositions may also be advantageously employed. Plasticisers, such as dibutyl phthalate may be added to provide stencil flexibility. Pigment dispersions or dyes may be added to provide a coloured image. These dyes may be of the indicator type to provide a visible colour change after exposure. Tensides to improve the coating properties of the composition may also be added as may buffer solutions to control the pH.

We have found that while the acid crosslinkable copolymer is stable in this form and has significant pot life both sensitised and unsensitised, once the coating is applied to a substrate, dried, exposed and developed, acid crosslinking can very effectively be achieved between the copolymer itself and between the copolymer and the polyvinyl alcohol. It is to be noted that in this respect the polyvinyl alcohol is not merely a binder in the composition but forms an integral part of the crosslinking process. Some of the polyvinylalcohol would of course remain uncrosslinked and hence would serve merely its known purpose as a binder.

The compositions of the present invention would be expected to have at least one years stability in an unsensitised state and at least one month when sensitised by diazo. It is surprising that the acidic nature of the diazo and any of its decomposition products do not cause premature curing i.e. gelling of the sensitised emulsion on storage. It is believed that premature curing does not occur because the addition copolymer is held in an aqueous dispersion rather than in solution. On exposure the diazo sensitiser provides a degree of insolubilisation of the coating which is sufficient to allow a stencil to be produced when the coatings are applied in the normal way, exposed through a positive and developed in a water spray.

Whereas, the compositions of prior art coatings showed only a limited increase in water resistance when subsequently treated by strong acids the compositions of the present invention show a great increase in water resistance. The present invention is also essentially non-aqueous solvent free thus eliminating the toxicological and fire hazard posed by present acid crosslinkable systems.

The subsequent acid crosslinking is possible because, although the acid released by the initiator could do this once the initiator is activated on exposure to radiation, (as it does in the Japanese specifications referred to above), the copolymer here is in the form of a dispersion so that crosslinking between the particles of the dispersion is not possible until they are wetted by the acid which is achieved in the post or second phase curing of the present invention. Moreover, whereas the compositions of the Japanese specifications referred to above require a multi-stage process including the use of solvents to provide the formulation with acid crosslinkable groups, the present invention relies only on a simple one stage emulsion copolymerisation.

Strong acids are useful for this second phase cure (or the chromium, zirconyl, aluminium or iron salts of these acids). Especially useful is a solution of hydrochloric acid. The post curing solution is applied to both sides of the screen printing stencil using a sponge or cloth and dried at up to 70° C. The upper limit of the curing temperature being limited by the nature of the mesh support. Normally a temperature of 60° C. is utilised. The cure time needs to be estimated for each particular composition.

DETAILED DESCRIPTION OF PREFERRED EMBODIMENTS

The invention is demonstrated by the following non limiting examples:

EXAMPLE 1

A mixture according to the following formulation was blended by step wise addition of the following materials:

56.3 g National 125-2811[1]
37.9 g of a 13% w/w aqueous solution Gohsenol GH2O[2]
3.0 g Dibutyl phthalate
1.7 g Sodium acetate
0.03 g Glacial acetic acid
0.2 g Imperon Blue KB[3]

[1] is believed to be a copolymer of vinyl acetate and N-methylol acrylamide, dispersed in polyvinyl alcohol and sold by National Adhesives Co. Ltd.
[2] is a polyvinyl acetate hydrolysed between 87 and 89% to polyvinyl alcohol and sold by Nippon Gohsei.
[3] is an aqueous pigment dispersion sold by Hoechst UK Ltd.

The composition was filtered through a 90 mesh sieve and then sensitised with 1 g of a syrup diazo sensitiser prepared by the condensation of p-diazodiphenylamine hydrogen sulphate and formaldehyde in 85% phosphoric acid at 40° C. The sensitised coating was applied (2 coats each side of the screen) using a scoop coater to a 62TW mesh screen, dried and exposed for 100 seconds using a 3KW metal halide source at 1.2 m. The screen was washed out in the usual way to remove the unexposed parts of the emulsion. The resulting screen printing stencil showed good print resolution.

After drying, a 4% solution of toluene-4-sulphonic acid was applied to the screen stencil and dried at 60° C. for 2 hours. Screen printing using the resultant stencil with Texiscreen Red (a water based ink from the Sericol Group Limited) gave in excess of 15,000 prints without any discernible wear.

A similar screen without the toluene-4-sulphonic acid post treatment showed wear after only 500 impressions.

Using a vinyl acetate homopolymer such as National Adhesives 225-1025 in place of the crosslinkable 125-2811 gave only 4000 impressions before wear was apparent even after post treatment with 4% toluene-4-sulphonic acid as above.

EXAMPLE 2

This example demonstrates the use of a powder diazo sensitiser stabilised with a Lewis acid. A mixture according to the following formulation was blended by step wise addition of the following materials 55 g National 125-2811[1]
37 g of a 13% w/w aqueous solution of Gohsenol GH 20[2]
4.8 g dibutyl phthalate
0.2 g Imperon Blue KB[3]

1,2 and 3 are described in Example 1.

The composition was filtered as before and sensitised with 0.5 g of Fairmount Diazo No 4 (obtained from the Fairmount Chemical Corp. USA) dissolved in 3 ml warm water. The coating was applied (2 coats on each side of the screen) to a 90 HDA mesh and exposed through a positive for 70 seconds to a 3 kw metal halide source at 1.2 m and developed in the usual way to provide a screen stencil with good reproduction of detail.

After drying the coating was treated with a 2% hydrochloric acid solution and dried at 50° C. for 2 hours. Screen printing the resultant stencil was Texiscreen Red ink gave over 15,000 impressions without any discernible wear.

EXAMPLE 3

This Example demonstrates the effect of changing the amount of acid crosslinkable monomer in the addition emulsion copolymerisation. Addition copolymerisations were carried out using a 4% aqueous solution of saponified polyvinyl acetate as stabiliser at 80° C., using ammonium persulphate as initiator to provide a 55% w/w solids emulsion by copolymerising vinyl acetate and N-methylol acrylamide. Three emulsions of vinyl acetate and N-methylol acrylamide were prepared, each with a different ratio of vinyl acetate to N-methylol acrylamide. The first was 100% vinyl acetate, the second was 98% vinyl acetate, 2% N-methylol acrylamide and the third was 95% vinyl acetate, 5% N-methylol acrylamide, each percentage being by weight.

Each of these emulsions were included in a photosensitive composition by blending together the following by stepwise addition:

56.3 g The emulsion as prepared above
37.9 g of a 13% w/w aqueous solution of Gohensol GH 20[2]
3.0 g Dibutyl phthalate
1.7 g Sodium acetate
0.03 g Glacial acetic acid

| -continued |
|---|
| 0.2 g Imperon Blue KB[3] |

2 and 3 are as Example 1 above.

Each composition was sensitised and applied to a screen as in Example 1 to provide three screen printing stencils. In each case secondary phase curing was effected using a 2% solution of hydrochloric acid as in Example 2.

Upon subjecting each screen to screen printing with Texiscreen Red the screen having 100% vinyl acetate emulsion showed considerable wear after only 5,000 prints whereas both screens having 2 or 5% N-methylol acrylamide showed no sign of wear after 15,000 prints each.

I claim:

1. A one pot screen printing composition having improved shelf life; said composition comprising:
   a. a stabilized aqueous dispersion of a cross-linking agent which is a water insoluble addition copolymer of vinyl acetate and N-methylol acrylamide, said N-methylol acrylamide being present in an effective amount for cross-linking with polyvinyl alcohol;
   b. polyvinyl alcohol in an amount which is effective to stabilize said water insoluble copolymer dispersion;
   c. a photosensitizer which is a condensation product of an aromatic diazo compound with an acid condensable active carbonyl compound in an amount which is effective to first insolublize the polyvinyl alcohol upon exposure to actinic radiation without cross-linking occurring between the hydroxy and N-methylol functionalities;
   said vinyl acetate/N-methylol acrylamide cross-linking copolymer and polyvinyl alcohol being present in separate phases whereby the shelf life is extended in the presence of the cross-linking agent contained in the composition and wherey said separate phases inhibit an acid induced reaction between the hydroxy functionalities of the polyvinyl alcohol and the N-methylol groups as the diazo compound produces acid upon exposure to actinic radiation;
   said composition being free of non-aqueous solvent.

* * * * *